Figure 1:
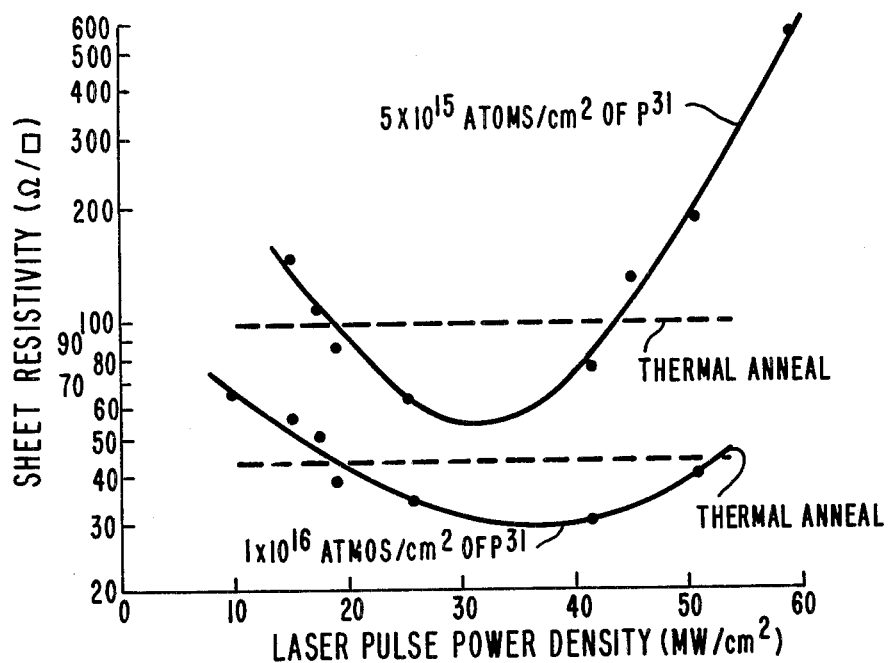

United States Patent
Wu

[11] 4,198,246
[45] Apr. 15, 1980

[54] PULSED LASER IRRADIATION FOR REDUCING RESISTIVITY OF A DOPED POLYCRYSTALLINE SILICON FILM

[75] Inventor: Chung P. Wu, Mercerville, N.J.

[73] Assignee: RCA Corporation, New York, N.Y.

[21] Appl. No.: 963,818

[22] Filed: Nov. 27, 1978

[51] Int. Cl.$^2$ .......................................... H01L 21/263
[52] U.S. Cl. ................................ 148/1.5; 219/121 L; 357/18; 357/91; 427/35
[58] Field of Search ..................... 148/1.5; 357/91, 18; 219/121 L; 427/35

[56] References Cited

U.S. PATENT DOCUMENTS

| | | | |
|---|---|---|---|
| 3,585,088 | 6/1971 | Schwuttle et al. | 148/174 |
| 4,059,461 | 11/1977 | Fan et al. | 148/1.5 |

FOREIGN PATENT DOCUMENTS 2284189  2/1976  France ................. 250/492 R

OTHER PUBLICATIONS

Narayan et al., "... Laser ... Annealing ... B-Implanted Si", J. Appl. Phys. 49 (Jul. 1978), 3912.
Krynicki et al., "Laser Annealing ... As Implanted Si", Phys. Letts., 61A (1977), 181.
Foti et al., "... Laser Annealing ... Si Samples", Appl. Phys. 15 (Apr. 1978), 365.
Young et al., "Laser Annealing ... Si", Appl. Phys. Letts., 33 (Jul. 1978), 14.
Battaglin et al., "... Laser Annealing ... Implanted Si", Phys. Stat. Sol. 499 (Sep. 1978), 347.
Shtyrkov et al., "Local Laser Annealing ... Layers", Sov. Phys. Semicond. 9 (1976), 1309.
Antonenko et al., "... Implanted Impurity in Si ... ", Sov. Phys. Semicond. 10 (1976), 81.
Kutukova et al., "Laser Annealing ... Si", Sov. Phys. Semicond. 10 (1976), 265.
"Laser Annealing ... for ... P. N. Junctions", Physics Today, Jul. 1978, pp. 17-20.
Young et al., "Laser Annealing ... B Implanted Si", Appl. Phys. Letts. 32 (Feb. 1978), 139.
Gat et al., "A Laser ... Annealing ... in S/C", Appl. Phys. Letts. 32 (Feb. 1978), 142.
Golovchenko et al., "Annealing ... GaAs by ... Laser ... ", Appl. Phys. Letts. 32 (Feb. 1978), 147.
Celler et al., "... Regrowth ... by Laser Irradiation", Appl. Phys. Letts. 32 (Apr. 1978), 464.
"Laser Annealing ... ", Science, 201 (Jul. 1978), 333.
"Laser Annealing ... ", Semiconductor Industry News, Nov.-Dec. 1978.

*Primary Examiner*—L. Dewayne Rutledge
*Assistant Examiner*—Upendra Roy
*Attorney, Agent, or Firm*—H. Christoffersen; D. S. Cohen; T. H. Magee

[57] ABSTRACT

A method of reducing the resistivity of a doped polycrystalline silicon film deposited on a substrate comprises the step of irradiating the film with a laser pulse having an energy density of less than about 1.5 joules per square centimeter.

8 Claims, 4 Drawing Figures

PULSED LASER IRRADIATION FOR REDUCING RESISTIVITY OF A DOPED POLYCRYSTALLINE SILICON FILM

This invention relates to a method of reducing the resistivity of a doped polycrystalline silicon film disposed on a substrate, and the structure produced in accordance with this method.

Deposited films of doped polycrystalline silicon are used in integrated circuit devices as a conducting material. These deposited films ordinarily overlie insulating material, which may be silicon dioxide and/or silicon nitride formed as a coating on a body of silicon, or may be sapphire in the so-called silicon-on-sapphire (SOS) technology. One example of the use of polycrystalline silicon as a conductor is the self-aligned gate metal-oxide-semiconductor (MOS) devices, in which a polycrystalline silicon film of defined shape serves as a gate electrode. Polycrystalline silicon is also used for fabricating polycrystalline silicon contacts and interconnects utilized for electrically connecting various active and passive elements disposed on the same integrated circuit chip.

Polycrystalline silicon films with dopings similar to those in monocrystalline silicon wafers or epitaxial layers have higher resistivity than the monocrystalline silicon. This is true both for gaseous doped, diffused or ion implanted polycrystalline silicon films. In order to reduce the resistivity of such films they are thermally annealed at high temperatures, typically by heating the films to 1000° C. in dry nitrogen for approximately 15 minutes. In certain applications, such as radiation-hard integrated circuit devices, heating at such high temperatures degrades the operating performance of the devices.

Recent experiments have shown that laser radiation can be successfully used to anneal monocrystalline silicon substrates which have been damaged by ion implantation. A thin layer of material at or near the surface of the crystal is damaged during the implantation, often being driven completely amorphous. Laser annealing has been utilized to restore the crystallinity of this implanted layer. However, an energy density of at least about 2 to 4 joules per square centimeter is required for single-crystal silicon, because the crystallization process takes place by first melting the silicon and then regrowing the layer adjacent the underlying single-crystal substrate. Also, the area of a typical integrated circuit wafer is about 25 cm$^2$ or greater. Since the maximum energy density available, using present technology, from a single laser pulse which irradiates the entire wafer surface area is less than 2 joules per square centimeter, such laser annealing requires some form of scanning mechanism utilizing a higher-power laser beam which irradiates a smaller surface area. The present invention comprises an economical method of reducing the resistivity of a deposited polycrystalline silicon film to a value lower than that previously obtainable by the thermal annealing of a polycrystalline film doped to saturation during film deposition.

In the drawings:

FIGS. 1 through 4 are a series of diagrams illustrating the results of sheet resistivity as a function of impurity concentration and laser pulse power density for laser irradiated polycrystalline silicon film samples.

In accordance with the novel method of the present invention, a doped polycrystalline silicon film disposed on a substrate is irradiated with a laser pulse having an energy density of less than about 1.5 joules per square centimeter. Several samples to be irradiated were prepared by depositing a film of polycrystalline silicon on a substrate, and then implanting conductivity modifiers into the film to achieve the desired doping level utilizing conventionally known techniques. However, the film could be doped by any other technique, such as by doping to saturation during the actual film deposition or doping by a diffusion technique after film deposition. In the present embodiment, each sample comprised a doped polycrystalline silicon film deposited on a 0.5 $\mu$m layer of silicon dioxide grown on a silicon wafer, although any other type of substrate may be utilized such as sapphire, quartz or a combination of oxide and silicon nitride. The polycrystalline silicon films in the present samples have a thickness of about 1 micrometer and are ion implanted with either N or P type conductivity modifiers to a dose of between about $1 \times 10^{15}$ and $1 \times 10^{16}$ atoms per square centimeter. The sheet resistances of the as-implanted samples were greater than 10,000 $\Omega/\square$.

The samples were then irradiated with a laser pulse at different energy densities. Some samples were irradiated with a Q-switched Nd:glass laser having a wavelength of 1.06 $\mu$m and a pulse duration time of about 30 nanoseconds, while other samples were irradiated with a Q-switched ruby laser having a wavelength of 0.69 $\mu$m and a pulse duration time of about 30 nanoseconds. The pulse duration time may vary but is preferably between about 20 and about 40 nanoseconds.

Referring to Tables I and II, there is shown the results of sheet resistivity measurements taken on the differently irradiated samples utilizing conventional four point probes for the measurements. In one set of samples the polycrystalline silicon film is doped with $P^{31}$ to a dose of $5 \times 10^{15}$ atoms/cm$^2$, while in a second set of samples the film is doped with $P^{31}$ to a dose of $1 \times 10^{16}$ atoms/cm$^2$.

TABLE I

| Q-SWITCHED Nd:GLASS LASER | | |
|---|---|---|
| IMPLANT DOSE (ATOMS/cm$^2$) | ENERGY DENSITY (JOULES/cm$^2$) | SHEET RESISTIVITY $\rho_s$ ($\Omega/$ ) |
| $5 \times 10^{15}$ OF $P^{31}$ | 0.29 | HIGHLY RESISTIVE |
| $5 \times 10^{15}$ OF $P^{31}$ | 0.45 | 146 |
| $5 \times 10^{15}$ OF $P^{31}$ | 0.52 | 108 |
| $5 \times 10^{15}$ OF $P^{31}$ | 0.57 | 86 |
| $5 \times 10^{15}$ OF $P^{31}$ | 0.77 | 63 |
| $5 \times 10^{15}$ OF $P^{31}$ | 1.24 | 75 |
| $5 \times 10^{15}$ OF $P^{31}$ | 1.35 | 129 |
| $5 \times 10^{15}$ OF $P^{31}$ | 1.52 | 183 |
| $5 \times 10^{15}$ OF $P^{31}$ | 1.78 | 552 |
| $5 \times 10^{15}$ OF $P^{31}$ | THERMAL ANNEAL 1000° C., 15 MIN. IN N$_2$ | 96 |
| $1 \times 10^{16}$ OF $P^{31}$ | 0.29 | 65 |
| $1 \times 10^{16}$ OF $P^{31}$ | 0.45 | 56 |
| $1 \times 10^{16}$ OF $P^{31}$ | 0.52 | 50 |
| $1 \times 10^{16}$ OF $P^{31}$ | 0.57 | 39 |
| $1 \times 10^{16}$ OF $P^{31}$ | 0.77 | 34 |
| $1 \times 10^{16}$ OF $P^{31}$ | 1.24 | 30 |
| $1 \times 10^{16}$ OF $P^{31}$ | 1.52 | 39 |
| $1 \times 10^{16}$ OF $P^{31}$ | THERMAL ANNEAL 1000° C., 15 MIN. IN N$_2$ | 43 |

TABLE II

Q SWITCHED RUBY LASER

| IMPLANT DOSE (ATOMS/cm$^2$) | ENERGY DENSITY (JOULES/cm$^2$) | SHEET RESISTIVITY $\rho_s$ ($\Omega$/ ) |
|---|---|---|
| 5 × 10$^{15}$ OF P$^{31}$ | .12 | 150 |
| 5 × 10$^{15}$ OF P$^{31}$ | .16 | 113 |
| 5 × 10$^{15}$ OF P$^{31}$ | .22 | 105 |
| 5 × 10$^{15}$ OF P$^{31}$ | .29 | 87 |
| 5 × 10$^{15}$ OF P$^{31}$ | .39 | 75 |
| 5 × 10$^{15}$ OF P$^{31}$ | .52 | 87 |
| 5 × 10$^{15}$ OF P$^{31}$ | .62 | 85 |
| 5 × 10$^{15}$ OF P$^{31}$ | .86 | 101 |
| 5 × 10$^{15}$ OF P$^{31}$ | THERMAL ANNEAL 1000° C., 15 MIN. IN N$_2$ | 96 |
| 1 × 10$^{16}$ OF P$^{31}$ | .12 | 53 |
| 1 × 10$^{16}$ OF P$^{31}$ | .16 | 47 |
| 1 × 10$^{16}$ OF P$^{31}$ | .22 | 48 |
| 1 × 10$^{16}$ OF P$^{31}$ | .29 | 40 |
| 1 × 10$^{16}$ OF P$^{31}$ | .39 | 33 |
| 1 × 10$^{16}$ OF P$^{31}$ | .52 | 34 |
| 1 × 10$^{16}$ OF P$^{31}$ | .62 | 38 |
| 1 × 10$^{16}$ OF P$^{31}$ | THERMAL ANNEAL 1000° C., 15 MIN. IN N$_2$ | 43 |

Table I gives sheet resistivity measurements for both sets of samples irradiated at different energy densities with a Q-switched Nd:glass laser having a pulse duration time of about 30 nanoseconds. Table II gives sheet resistivity measurements for both sets of samples irradiated at different energy densities with a Q-switched ruby laser having a pulse duration time of about 30 nanoseconds. Also listed in each table are sheet resistivity measurements taken on both sets of samples which, instead of being laser irradiated, were thermally annealed at 1000° C. in dry nitrogen for fifteen minutes.

In order to graphically show how the method of the present invention may reduce the resistivity of a doped polycrystalline silicon film to a value lower than that obtainable by thermal annealing, FIGS. 1 through 4 illustrate the results of sheet resistivity measurements as a function of impurity concentration and laser pulse power density (MW/cm$^2$) taken on sets of samples ion implanted with B$^{11}$ and As$^{75}$, in addition to the above sets of samples. The dashed line which intersects each curve shows the sheet resistivity measurement obtained after thermally annealing that particularly doped sample at 1000° C. in dry nitrogen for fifteen minutes.

Figure 2:
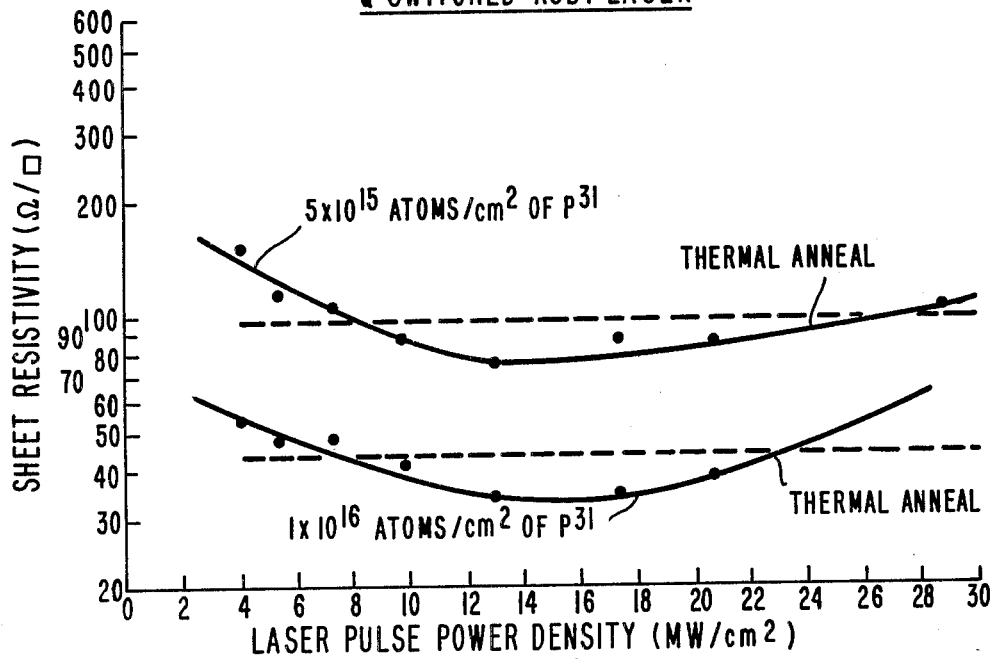
Figure 3:
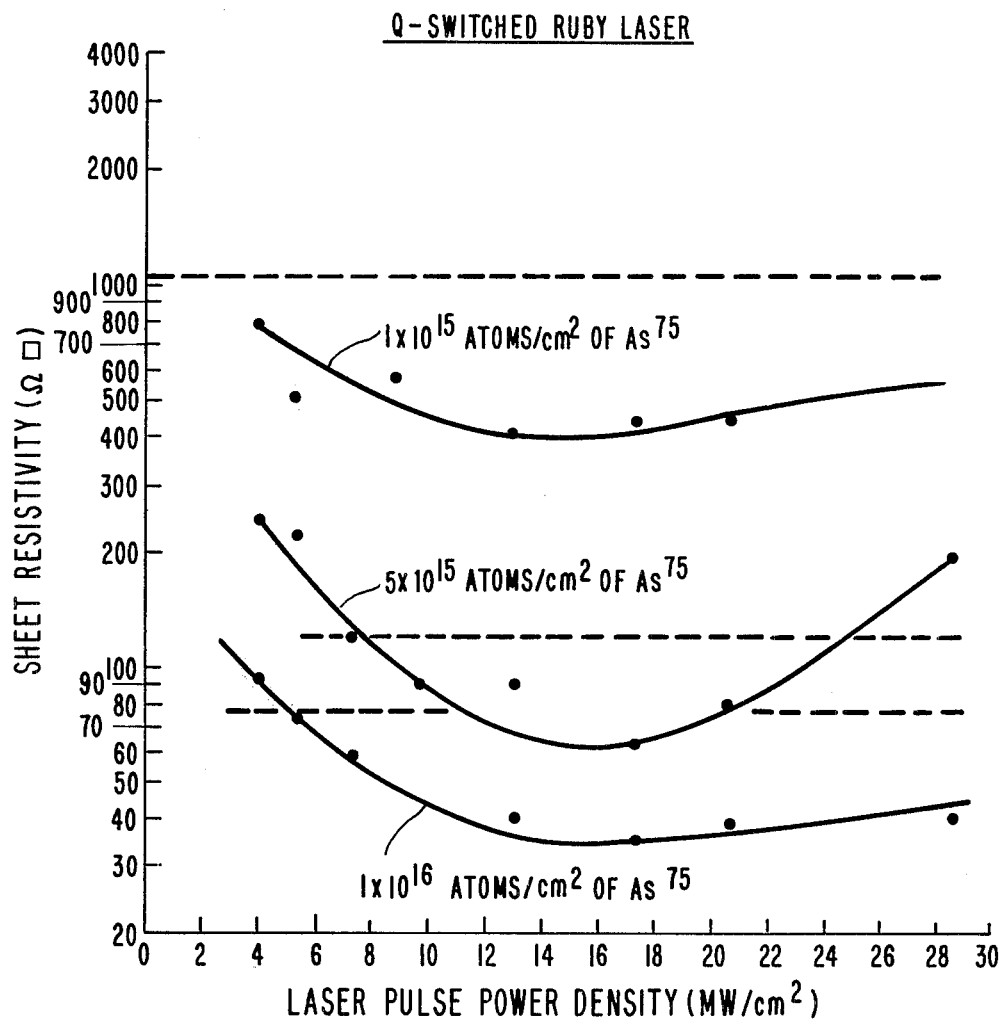
Figure 4:
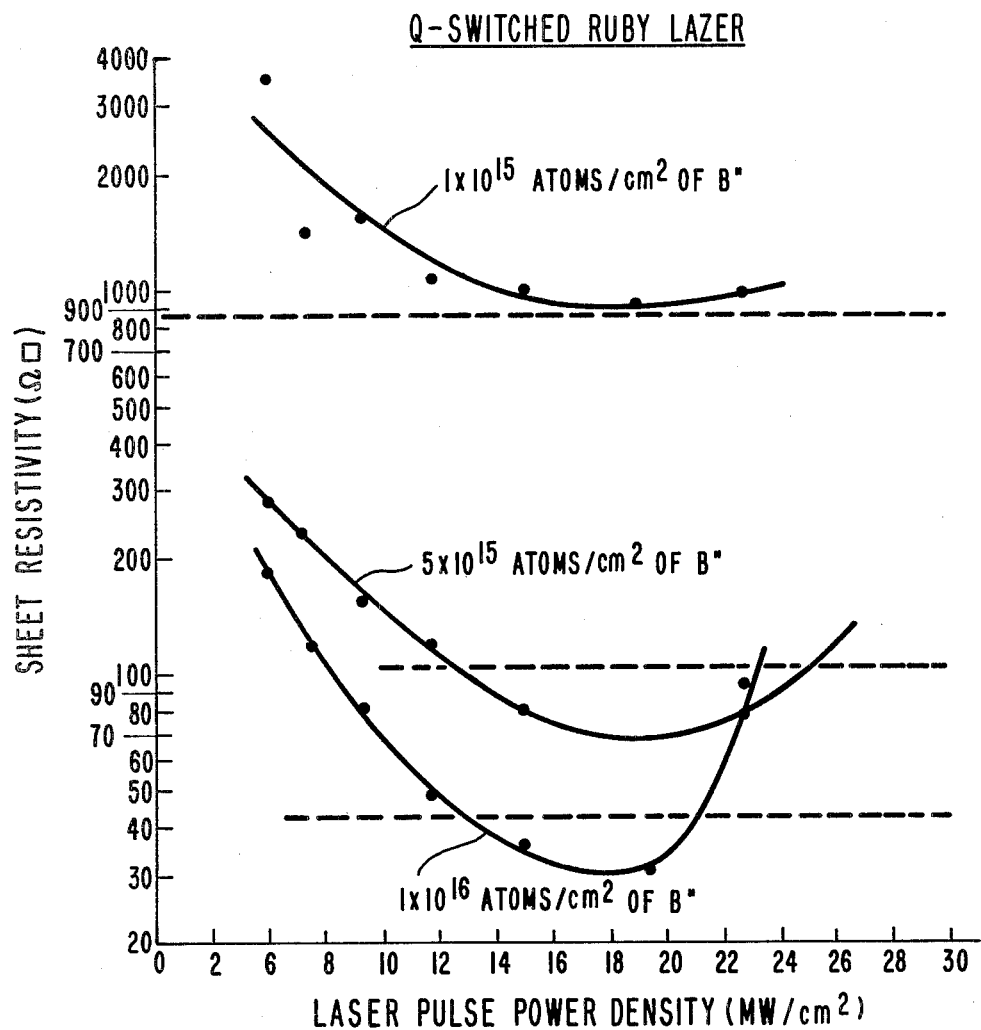

FIGS. 1 and 2 illustrate data on the first two sets of samples ion implanted with P$^{31}$ to doses of 5×10$^{15}$ atoms/cm$^2$ and 1×10$^{16}$ atoms/cm$^2$, respectively, and then irradiated with either the Nd:glass laser or the ruby laser at different laser pulse power densities. Note the change in scale used for the abscissa for the different lasers. FIGS. 3 and 4 illustrate data on six additional sets of samples ion implanted with As$^{75}$ and B$^{11}$ to doses of 1×10$^{15}$ atoms/cm$^2$, 5×10$^{15}$ atoms/cm$^2$, and 1×10$^{16}$ atoms/cm$^2$, respectively. The sheet resistances of the as-implanted polycrystalline silicon films were greater than 10 M$\Omega$/□, but dropped by a significant factor when irradiated by the ruby laser pulse with power density as low as 4 MW/cm$^2$. In all cases where the samples were irradiated with the ruby laser, the sheet resistances dropped to minimum values at 16 MW/cm$^2$ for the ruby laser pulse power density. At higher laser pulse power densities, the thin polycrystalline silicon films started to blister, and the measured sheet resistances also started to increase. It should be noted that these minimum sheet resistance values obtained with a relatively low power density of the ruby laser can be as much as two to three times lower than resistance values (represented by the dashed lines) for those samples thermally annealed at 1000° C. for fifteen minutes in dry nitrogen. The optimum pulse power density of the Nd:glass laser is roughly twice that of the ruby laser for heavily implanted films, and higher yet for medium and lightly doped samples. This may be attributed to the decreased absorption by silicon at longer wavelengths, and also implanted dosage dependence effects.

FIG. 3 shows the data for samples implanted with As$^{75}$ ions instead of P$^{31}$ or B$^{11}$ ions. The data is quite similar to that presented in FIG. 4 for B$^{11}$ except for the lower-doped sample where the minimum sheet resistivity at ~16 MW/cm$^2$ is approximately a factor of 2 lower than similarly doped samples implanted with B$^{11}$ or P$^{31}$. This is probably a damage dependence effect wherein the extra damages created by the heavier As$^{75}$ ions resulted in better coupling between the laser pulse and the solid material.

The essence of the present invention resides in the discovery that the resistivity of a doped polycrystalline silicon film disposed on a substrate can be reduced, below resistivity values previously obtainable, by irradiating the film with a laser pulse having an energy density significantly below that required for laser annealing single-crystal bulk silicon. I found that substantially complete electrical activation of the implanted dopant atoms can be achieved with a pulse energy density approximately ⅓ of that required for bulk silicon, and that a 2 to 3 times reduction in resistivity can be achieved in implanted polycrystalline silicon films compared with control samples which were thermally annealed. The morphology of the polycrystalline silicon films before and after the laser irradiation was studied, and significant changes in grain size were observed. It is believed that the higher electrical resistivity is due to the presence of numerous grain boundaries in the polycrystalline film, and that the lower-power laser irradiation is sufficient to fuse these grain boundaries together to form bigger single crystal areas and to electrically activate >90% of the doping atoms as compared with 30–50% for thermally annealed samples, and thereby decrease the resistivity. The unexpectedly small amount of laser pulse energy required could possibly be explained by (1) increased absorption by the polycrystalline grain boundaries, (2) internal reflection at the polycrystalline film-substrate interface, and/or (3) the fact that a fusion process takes place instead of a process where the silicon is first melted and then regrown adjacent an underlying single-crystal substrate. Ion implanted profiles in the polycrystalline silicon after laser annealing were obtained by SIMS (Secondary Ion Mass Spectrometry) and it was found that there was little or no spatial redistribution of the as-implanted profiles, and thus such profiles were radically different from those annealed thermally. Such observations support the model that individual grains of the polycrystalline film were fused together by the laser irradiation, and that the doping atoms become electrically active without diffusion along grain boundaries.

The discovery that laser irradiation at an energy pulse density of less than about 1.5 joules per square centimeter, or equivalently 50 megawatts per square centimeter, effectively reduces the resistivity of a doped polycrystalline silicon film is very important commercially. It makes laser annealing of polycrystalline silicon films in integrated circuit (IC) devices very attractive economically since the entire IC wafer can now be laser annealed with a single pulse, and any form of scanning mechanism utilizing a higher-power laser beam for irradiating a smaller surface area is no longer required. As illustrated by the data, ruby laser irradiation achieves results similar to Nd:glass laser irradiation but with lower laser pulse power density. Still lower pulse power densities may be achieved by irradiation from lasers with yet shorter wavelengths.

What is claimed is:

1. A method of reducing the resistivity of a doped polycrystalline silicon film disposed on a substrate comprising the step of irradiating said film with a laser pulse having an energy density of less than about 1.5 joules per square centimeter.

2. A method as recited in claim 1 wherein said laser has a pulse duration time of between about 20 and about 40 nanoseconds.

3. A method as recited in claim 1 wherein said laser is a Q-switched Nd:glass laser having a pulse energy density of between about 0.5 and 1.5 joules per square centimeter, and a pulse duration time of about 30 nanoseconds.

4. A method as recited in claim 1 wherein said laser is a Q-switched ruby laser having a pulse energy density of between about 0.2 and 0.8 joules per square centimeter, and a pulse duration time of about 30 nanoseconds.

5. A method as recited in claim 1 wherein said substrate comprises a silicon wafer having a layer of silicon dioxide disposed thereon, said polycrystalline film being deposited on the silicon dioxide layer.

6. A structure produced in accordance with the method of claim 1.

7. A method as recited in claim 5 wherein said polycrystalline silicon film has a thickness of about 1 micrometer and is doped with N type conductivity modifiers to a dose of between about $1 \times 10^{15}$ and $1 \times 10^{16}$ atoms per square centimeter.

8. A method as recited in claim 7 wherein said N type conductivity modifiers comprise arsenic (As).